United States Patent [19]

Shigeki et al.

[11] Patent Number: 5,304,833

[45] Date of Patent: * Apr. 19, 1994

[54] COMPLEMENTARY MOS SEMICONDUCTOR DEVICE

[75] Inventors: Komori Shigeki; Mitsui Katsuyoshi, both of Hyogo, Japan

[73] Assignee: Mitsubishi Electric Corporation, Kanagawa, Japan

[*] Notice: The portion of the term of this patent subsequent to Aug. 11, 2009 has been disclaimed.

[21] Appl. No.: 700,180

[22] PCT Filed: Sep. 10, 1990

[86] PCT No.: PCT/JP90/01151

§ 371 Date: May 13, 1991

§ 102(e) Date: May 13, 1991

[30] Foreign Application Priority Data

Sep. 12, 1989 [JP] Japan ................................ 1-236269

[51] Int. Cl.⁵ .................. H01L 29/76; H01L 29/94; H01L 31/062; H01L 31/119
[52] U.S. Cl. ................................ 257/372; 257/369; 257/371; 257/373
[58] Field of Search ........................ 357/41, 42, 23.4; 257/368, 369, 371, 372, 373

[56] References Cited

U.S. PATENT DOCUMENTS

5,138,420  8/1992  Komori et al. ................ 257/371

FOREIGN PATENT DOCUMENTS

56-94670  7/1981  Japan .
56-94671  7/1981  Japan .
56-94672  7/1981  Japan .
61-79247  4/1986  Japan .
61-79249  4/1986  Japan .
61-79250  4/1986  Japan .

*Primary Examiner*—Rolf Hille
*Assistant Examiner*—Wael Fahmy
*Attorney, Agent, or Firm*—Lowe, Price, LeBlanc & Becker

[57] ABSTRACT

To improve resistance to latch-up of complementary MOS semiconductor device, a high concentration buried layer (16) of same conduction type as a semiconductor substrate (1) and of concentration higher than the silicon semiconductor substrate is formed under a well region (5) of first conduction type in which MOS transistor of second conduction type is formed and a well region (3) of second conduction type in which MOS transistor of first conduction type is formed. The high concentration buried layer (16) reduces parasitic resistance of the semiconductor substrate (1), suppresses transfer of carrier due to surge or the like applied from outside and inside, and inhibits the parasitic transistors (12)(13) from turning on.

5 Claims, 8 Drawing Sheets

COMPLEMENTARY MOS SEMICONDUCTOR DEVICE

TECHNICAL FIELD

The present invention relates to a complementary MOS semiconductor device having a structure suitable for improvement of resistance to latchup.

BACKGROUND ART

In the art of complementary MOS semiconductor device (hereinafter referred to as CMOS) comprising p-channel and n-channel transistors, it has been increasingly demanded to establish a fine topographic technology with the need for high density and high integration while making the use of an advantage of small power consumption.

With regard to the structure of CMOS, a bipolar parasitic transistor circuit is arranged in the internal part in the same arrangement as thyrister. As a result, a problem exists in that when triggered by surge or the like from outside, an excessively large current may flow from power terminal to ground terminal causing thereby a phenomenon of latchup in which current still continues to flow even after disappearance of surge or the like, eventually resulting in breakdown of the device due to such large current. Under such circumstances, it may be said that a novel structure of CMOS is essential from the viewpoint of improvement of resistance to latchup, though requirements of the resistance will be more strict under the recent need for finer topography. Among several proposals ant attempts, retrograde well structure is known. FIG. 11 is a structural sectional view and circuit diagram schematically illustrating a structure of a CMOS inverter arranged in the simplest manner and a parasitic thyrister equivalent circuit.

In FIG. 11, reference numeral (1) indicates a p-type silicon semiconductor substrate of $1 \times 10^{15}$ cm$^{-3}$ in concentration and 10 Ω·cm in resistivity; numeral (2) indicates a field oxide film which is formed on one main surface of the mentioned p-type semiconductor substrate (1) and serving as a device separating region; numeral (3) indicates a n-well region which is formed by carrying out first implantation of phosphorus ion into an island-shaped region formed being separated by the mentioned field oxide film (2) on condition of 700 kev in acceleration voltage and $1 \times 10^{13}$ cm in dose, and second implantation of phosphorus ion on condition of 200 kev in acceleration voltage and $1 \times 10^{12}$ cm$^{-2}$ in dose; numeral (4) indicates a bottom part of higher impurity concentration ($1 \times 10^{16}$ to $1 \times 10^{17}$ cm$^{-3}$) in the mentioned n-well region (3); numeral (5) indicates a p-well region which is formed by carrying out first implantation of boron ion into a region adjacent the mentioned island-shaped n-well region (3) formed being separated by the mentioned field oxide film (2) on condition of 400 kev in acceleration voltage and $1 \times 10^{13}$ cm$^{-2}$ in dose, and second implantation of boron ion on condition of 100 kev in acceleration voltage and $1 \times 10^{12}$ cm$^{-2}$ in dose; numeral (6) indicates a bottom part of higher impurity concentration ($1 \times 10^{16}$ to $1 \times 10^{17}$ cm$^{-3}$) in the mentioned p-well region (5); numeral (7) indicates a n+-type well contact region for supplying potential to the mentioned n-well region (3); numeral (8) indicates a p+-type well contact region for supplying potential to the mentioned p-well region (5); numeral (9a) indicates a p+-type source region arranged in the mentioned n-well region (3) to form a p-channel transistor of the CMOS inverter; numeral (9b) indicates a p+-type drain region arranged in the mentioned n-well region (3) to form a p-channel transistor of the CMOS inverter together with the mentioned p+-type source region (9a); numeral (10a) indicates a n+-type source region arranged in the mentioned p-well region (5) to form a n-channel transistor of the CMOS inverter; numeral (10b) indicates a n+-type drain region arranged in the mentioned p-well region (5) to form a n-channel transistor of the CMOS inverter together with the mentioned n+-type source region (10a); numeral (11a) indicates a gate electrode of the p-channel transistor of the CMOS inverter; numeral (11b) indicates a gate electrode of the n-channel transistor of the CMOS inverter; numeral (12) indicates a parasitic PNP transistor in which said p+-source region (9a) is an emitter, said n-well region (3) is a base, and said p-type silicon semiconductor substrate (1) is a collector; numeral (13) indicates a parasitic NPN transistor in which said n+-source region (10a) is an emitter, said p-well region (5) is a base, and said p-type silicon semiconductor substrate (1) is a collector, said parsitic NPN transistor (13) forming a parasitic thyrister together with the mentioned parasitic PNP transistor (12). In addition, numeral (14) indicates a parasitic resistance of the mentioned n-well region (3), and numeral (15) is a parasitic resistance of the mentioned p-well region (5).

In the conventional CMOS of above arrangement, the parasitic resistance (14) drops due to formation of the bottom part (4) of high impurity concentration in the n-well region (3), thereby the parasitic PNP transistor (12) becomes difficult to turn on because of reduction in potential difference between the base and emitter. Furthermore, because of increase in concentration of a region corresponding to the base of the parasitic PNP transistor (12), recombination takes place frequently at the base, thus current amplification factor of the parasitic PNP transistor (12) being reduced.

Meanwhile, the parasitic resistance (15) drops due to formation of the bottom part (6) of high impurity concentration in the p-well region (5), thus the parasitic NPN transistor (13) becomes difficult to turn on because of reduction in potential difference between the base and emitter. Moreover, because of increase in concentration of a region corresponding to the base of the parasitic NPN transistor (13), recombination takes place frequently at the base, thus current amplification factor of the parasitic NPN transistor (13) is reduced.

Accordingly, loop gain of the parasitic thyrister formed of the parasitic PNP transistor (12) and the parasitic NPN transistor (13) is restricted, thereby resistance to latch-up being enhanced.

It is generally recognized that resistance to latchup of the conventional CMOS of above structure is intensified by 2 to 3 times as compared with the one having a bottom part without high impurity concentration, depending upon the distance between the n+-type source region (10a) corresponding to width of the base of the parasitic NPN transitor (13) and the n-well region (3).

It is, however, sometimes the case that when receiving a noise of backward component among noises of electronic apparatus generated outside the semiconductor chip and applying a voltage lower than ground potential (GND) to the n+-type drain region (10b), electrons are delivered to the p-type silicon semiconductor substrate (1) through the p-well region (5), and a part of the electrons is collected in the n-well region (3)

corresponding to the collector region of the parasitic NPN transistor (13), then comes to the n+-type well contact region (7) passing through the n-well region (3). As a result, a voltage drop occurs thereby p-n junction between the p+-source region (9a) and n-well region (3) being forward biased, and the parasitic PNP transistor (12) is turned on, permitting flow of collector current.

If this current is so large as to cause the p-n junction between the n+-drain region (10a) and p-well region (5) to be forward biased due to voltage drop by the parasitic resistance (15), then the parasitic NPN transistor (13) is turned on and collector current is generated, which brings about more intensive conduction state of the parasitic PNP transistor (12).

In such a state as positive feedback is applied in the mentioned manner, a problem exists in that a large current is left free to flow between V cc and GND irrespective of the current from the n+-type drain region (10b) serving as a first trigger, eventually resulting in thermal breakdown of the chip itself.

The present invention was made to solve the above problems and has an object of providing a CMOS of which resistance to latchup is sufficiently improved.

DISCLOSURE OF THE INVENTION

In the complementary MOS semiconductor device in accordance with the present invention, a high concentration buried layer of same conduction type as a silicon semiconductor substrate and for burying a higher concentration than the silicon semiconductor substrate is formed under a well region of first conduction type in which MOS transistor of second conduction type is formed and a well region of second conduction type in which MOS transistor of first conduction type is formed. As a result of such arrangement, the high concentration buried layer lowers parasitic resistance of the semiconductor substrate, and suppresses transfer of a carrier implanted or generated in the semiconductor substrate due to surge or the like applied from outside and inside, thereby inhibiting the parasitic PNP transistor and parasitic NPN transistor from turning on.

BEST MODE FOR CARRYING OUT THE INVENTION

The present invention is hereinafter described in detail with reference to the accompanying drawings.

Figure 1:
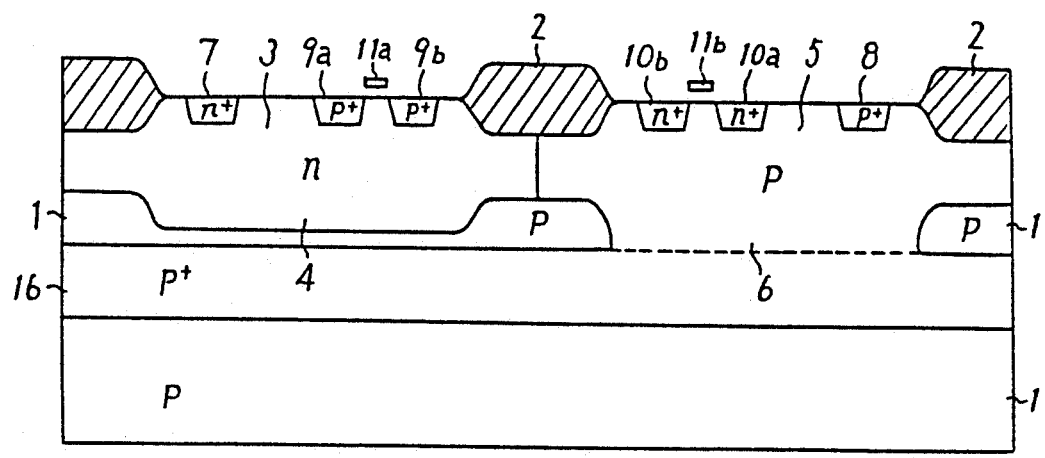
FIG. 1 is a structural sectional view illustrating an embodiment in accordance with the present invention.

FIG. 1 is a structural sectional view illustrating an embodiment of the present invention. In the drawing, reference numeral (16) indicates a high concentration burried layer for burrying high concentration which is $3 \times 10^{16}$ to $1 \times 10^{20}$ cm$^{-\beta}$ in concentration, $10^{-4}$ to 1 Ω cm in resistivity and 1 to 4 μm in thickness and formed by implanting boron ion on condition of 1.5 to 3 Mev in accelerating voltage and $2 \times 10^{12}$ to $1 \times 10^{15}$ cm$^{-2}$ in dose, said high concentration burried layer being formed flatly under the n-well region (3) in a depth range of 0.5 μm from the bottom of the n-well region (3) at a depth of 1 to 2 μm from the main surface of a p-type silicon semiconductor substrate (1) in such a manner as to be in contact with the bottom part of a p-well region (5). A p+-type buried layer is used in this embodiment.

Described hereunder is a manufacturing process of the CMOS of above arrangement with reference to FIGS. 3(a) to 3(m).

Figure 3A:
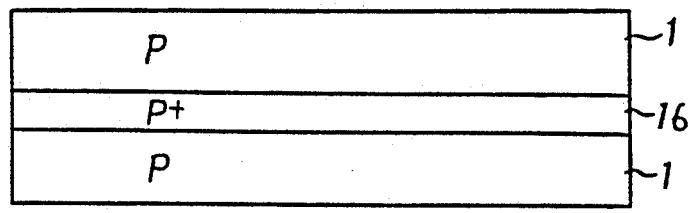
FIGS. 3(a) to 3(m) are sectional views illustrating manufacturing ring process of the embodiment shown in FIG. 1.

First, as illustrated in FIG. 3(a), boron ion is implanted in the surface of the p-type silicon semiconductor substrate (1) of $1 \times 10^{15}$ cm$^{-3}$ in concentration and 10 Ω·cm in resistivity on condition of 1.5 to 3 Mev in accelerating voltage and $2 \times 10^{12}$ to $1 \times 10^{15}$ cm$^{-2}$ in dosage so as to form the p+-type buried (16) of $3 \times 10^{16}$ to $1 \times 10^{20}$ cm$^{-3}$ in concentration, $10^{-4}$ to 1 106 cm in resistivity and about 1 to 4 μm in thickness.

Figure 3B:
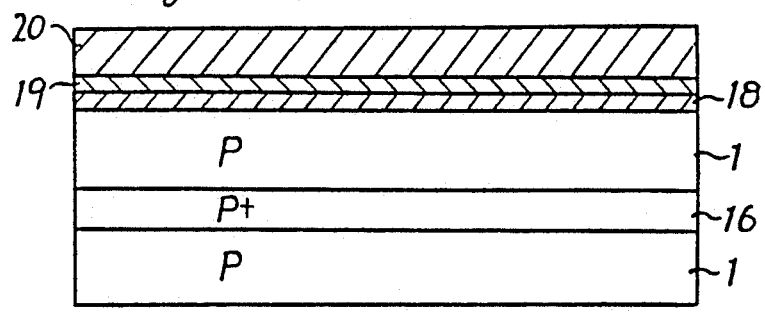

Then, as illustrated in FIG. 3(b), after forming a thermal oxide film (18) on the p-type silicon semiconductor substrate (1), a silicon nitride film (19) is formed on the thermal oxide film (18), and further a resist (20) is formed on the silicon nitride film (19).

Figure 3C:
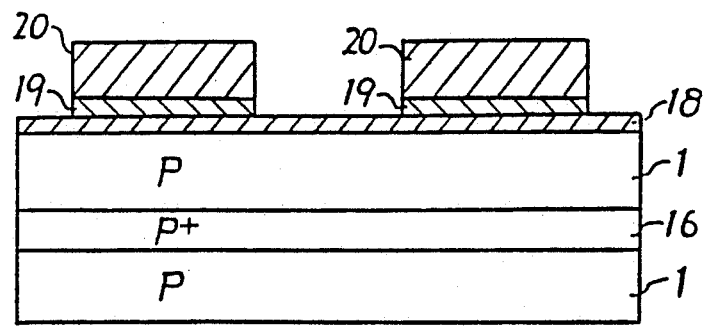

Then, as illustrated in FIG. 3(c), the resist (2) is subject to patterning by photo-etching in such a manner as to remain a region (well) for forming a device on the resist (20). The silicon nitride film (19) is then subject to patterning utilizing the pattern of the resist (20).

Figure 3D:
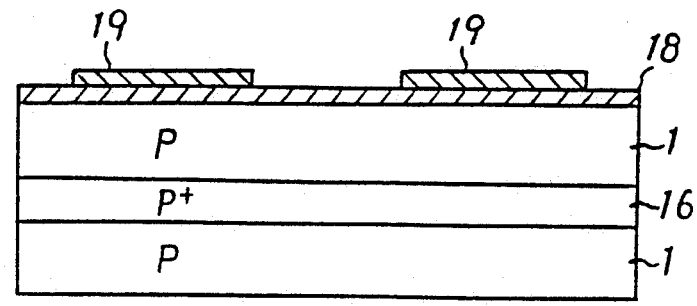

Then, as illustrated in FIG. 3(d), the pattern of the resist (20) is removed.

Figure 3E:
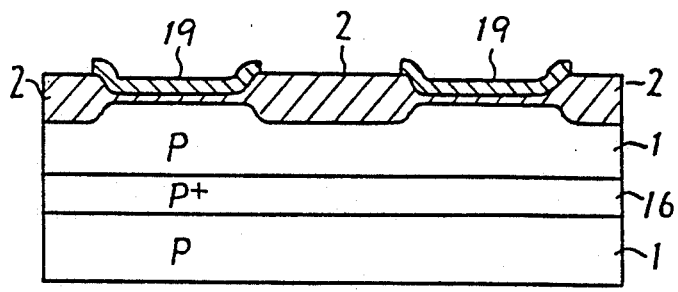

Then, as illustrated in FIG. 3(e), employing the patterned silicon nitride film (19) as a mask, a part of the p-type silicon semiconductor substrate (1) is selectively subject to oxidation at a low temperature of 900 to 1100° C., thereby forming a field oxide film (2) of about 5000Å in thickness.

Figure 3F:
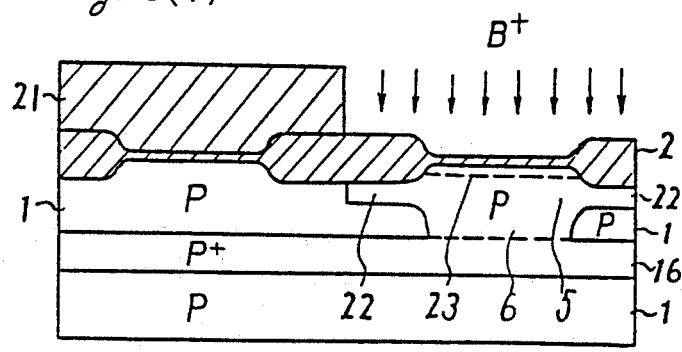

Then, as illustrated in FIG. 3(f), after removing the silicon nitride film (19), the pattern of the resist (21) is formed at a portion covering the n-well region to be formed. Then, employing the pattern of the resist (21) as a mask, a first implantation of boron ion is carried out in the main surface of an exposed portion of the semiconductor substrate (1) where p-well should be formed, on condition of 400 kev in accelerating voltage and $1 \times 10^{13}$ cm$^{-2}$ in dose. When selecting the accelerating voltage to be in the range of 350 to 450 kev, ion passes through the thick field oxide film (2), whereby boron comes to be implanted also in the under region (22) of the field oxide film (2).

Thereafter, the second implantation of boron ion is carried out in the same portion as the foregoing first ion implantation .utilizing the same mask (i.e., the resist (21)) on condition of 100 kev in accelerating voltage and $1 \times 10^{12}$ cm$^{-2}$ in dose. The accelerating voltage for carrying out this second ion implantation may be so low (50 to 150 kev) that the ion passing through the field oxide film (2) is caught in the field oxide film (2). As a result of this second ion implantation, the p-well region (5) is formed on the semiconductor substrate (1), the bottom of the p-well region (5) being in contact with the p+-type buried layer (16).

Depth of the p-well (5) is about 1.2 μm, and impurity concentration of the bottom portion (6) is higher than that of the surface portion ($1 \times 10^{16}$ to $1 \times 10^{17}$ cm$^{-3}$), and impurity concentration of the region (22) under the field oxide film (2) is also high ($1 \times 10^{16}$ to $1 \times 10^{17}$ cm$^{-3}$). Further implantation of boron ion is carried out in the same portion as the foregoing ion implantation utilizing the same mask (i.e., the resist (21)) on condition of 50 kev in accelerating voltage and $2.5\times 10^{12}$ cm$^{-2}$ in dose. This ion implantation is carried out for the purpose of preventing the n-channel transistor from punch-through and controlling threshold voltage, and in this sense boron is implanted in the channel region (23). Impurity concentration in this channel region (23) of the n-channel transistor is about $1\times 10^{16}$ cm$^{-3}$, which is low as compared with the concentration in the bottom portion (6).

Figure 3G:
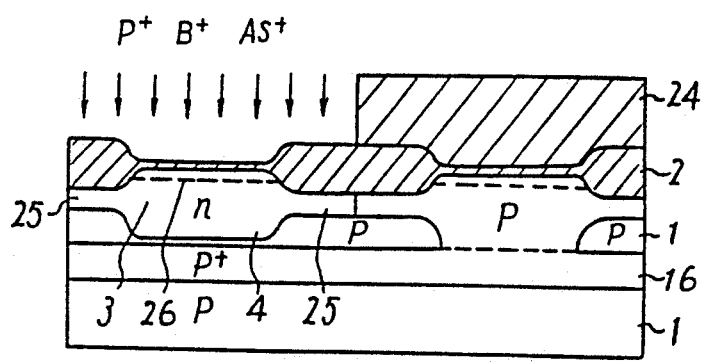

Then as illustrated in FIG. 3(g), after removing the pattern of the resist (21), pattern of a regist (24) is formed on the portion covering the p-well region (5). Then, employing the pattern of the resist (24) as a mask, a first implantation of phosphorus ion is carried out in the main surface of an exposed portion of the semiconductor substrate (1) where n-well should be formed, on condition of 700 kev in accelerating voltage and $1\times 10^{13}$ cm$^{31}$ $^2$ in dose. When selecting the accelerating voltage to be in the range of 400 to 1200 kev, ion passes through the thick field oxide film (2), whereby phosphorus comes to be implanted also in the under region (22) of the field oxide film (2).

Thereafter, the second implantation of phosphorus ion is carried out in the same portion as the foregoing first ion implantation utilizing the same mask (i.e., the resist (24)) on condition of 200 kev in accelerating voltage and $1\times 10^{12}$ cm$^{-2}$ in dose. The accelerating voltage for carrying out this second ion implantation may be 100 to 300 kev.

As a result of this second ion implantation, the n-well region (3) is formed on the semiconductor substrate (1). Depth of the n-well (3) is about 1.2 μm, and impurity concentration of the bottom portion (4) is higher ($1\times 10^{16}$ to $1\times 10^{17}$ cm$^{-3}$), and impurity concentration ration of the region (25) under the field oxide film (2) is also high ($1\times 10^{16}$ to $1\times 10^{17}$ cm$^{31}$ $^3$).

Then, implantation of boron ion is carried out in the same portion as the foregoing utilizing the same mask (i.e., the resist (24)) on condition of 20 kev in accelerating voltage and $2.5\times 10^{12}$ cm$^{-2}$ in dose, and at the same time implantation of arsenic ion follows on condition of 180 kev in accelerating voltage and $1.5\times 10^{12}$ cm$^{-2}$ in dose. This ion implantation is performed for the purpose of preventing the p-channel transistor from punch-through and controlling threshold voltage, and thus boron and arsenic are implanted in the channel region (26). Impurity concentration in this channel region (26) of the p-channel transistor is about $1\times 10^{16}$ cm$^{-3}$, which is low as compared with the concentration in the bottom portion (4).

Boron is jointly used for the purpose of balancing between threshold voltages of respective transistors formed in the p-well region (3) and n-well region (5).

Figure 3H:
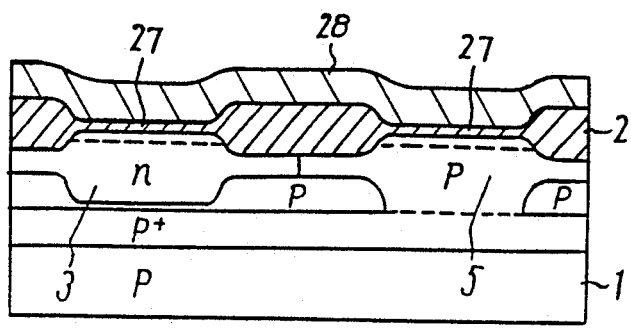

Thereafter, the pattern of the resist (24) and the thermal oxide film (28) on the p-well region (5) and n-well region (3) are removed, and as illustrated in FIG. 3(h), a gate oxide film (27) is formed on the main surfaces of the p-well region (5) and n-well region (3).

Thereafter, a polysilicon layer (28) serving as gate electrode is formed on the entire surface of the semiconductor substrate (1) including the gate oxide film (27).

Figure 3I:
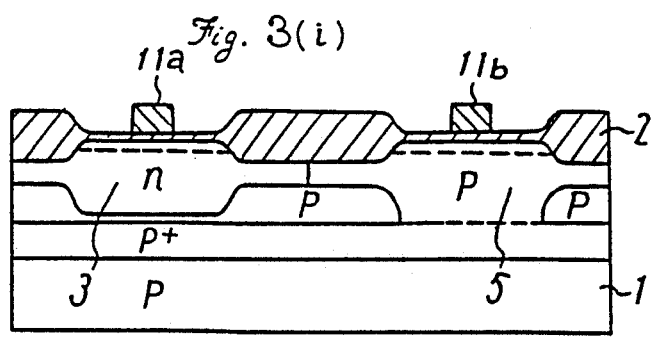
Figure 3J:
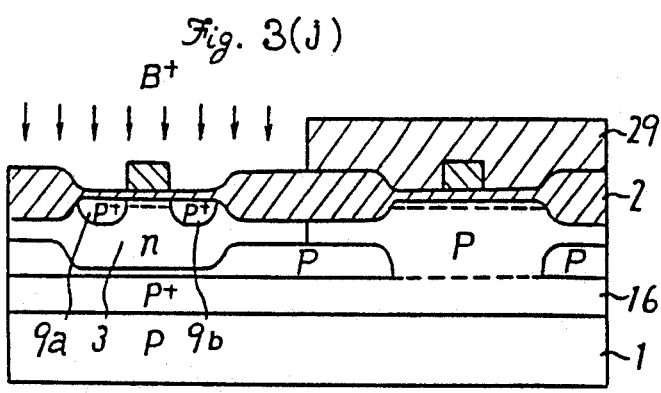

Then, as illustrated in FIG. 3(i), the polysilicon layer (28) is subject to patterning, whereby a gate electrode (11a) is formed on the n-well region (3) and a gate electrode (11b) on the p-well region (5).

Then, as illustrated in FIG. 3 (j), the p-well region (5) is covered with a pattern of a resist (29), and employing this pattern of the resist (29) as a mask, implantation of boron ion in the n-well region (3) is carried out in such a manner as to be self-matching to the gate electrode (11a). In this manner, the p$^+$-type source region (9a) and p$^+$-type drain region (9b) are formed in the n-well region (3) and, as a result, p-channel transistor is formed.

The pattern of the resist (29) is then removed.

Figure 3K:
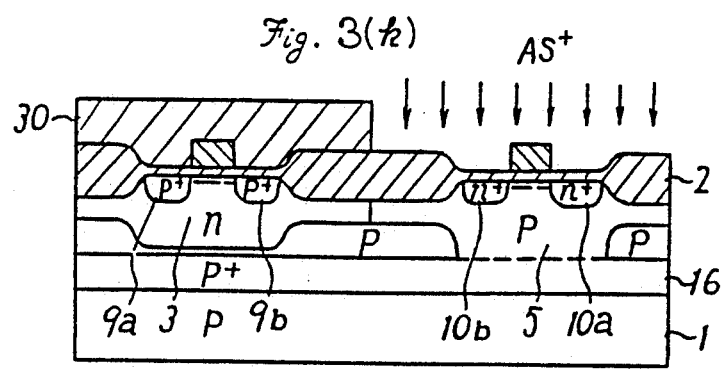

Then, as illustrated in FIG. 3(k), the n-well region (3) is covered with a pattern of a resist (30), and employing this pattern of the resist (30) as a mask, implantation of arsenic ion in the p-well region (5) is carried out in such a manner as to be self-matching to the gate electrode (11b). In this manner, the n$^+$-type source region (10a) and n$^+$-type drain region (10b) are formed in the p-well region (5) and, as a result, n-channel transistor is formed.

The pattern of the resist (30) is then removed.

Figure 3L:
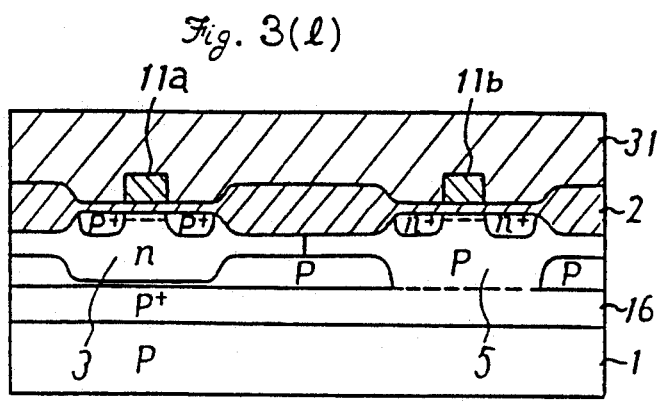

Then, as illustrated in FIG. 3(l), an insulating layer (31) comprising a silicon oxide film is formed on the entire main surface of the semiconductor substrate (1) including the gate electrodes (11a)(11b).

Figure 3M:
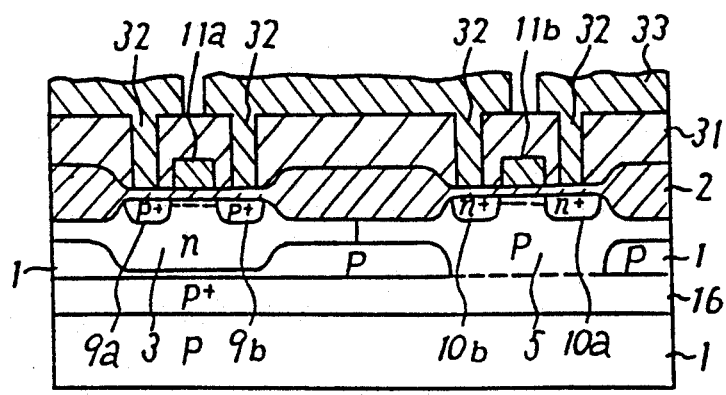
Figure 4:
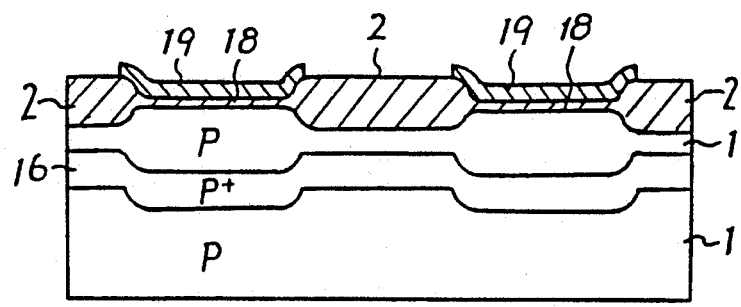
FIGS. 4 to 10 are structural sectional view respectively illustrating second to sixth embodiments in accordance with the present invention.

Thereafter, as illustrated in FIG. 3(m), contact holes (32) are provided through the insulating film (31), and when wiring with a aluminum metal (33), a CMOS inverter is completed.

Figure 2:
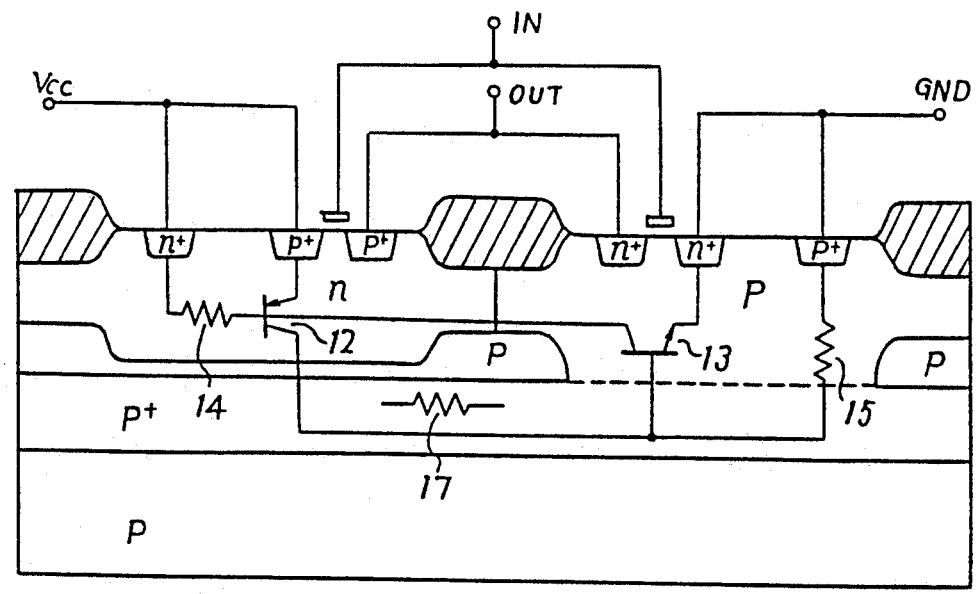
FIG. 2 is a circuit diagram of a parasitic thyrister equivalent circuit arranged considering parasitic bipolar transistor for the embodiment shown in FIG. 1.

In the CMOS of above arrangement, the p$^+$-type buried layer (16) formed under the n-well region (3) and p-well region (5) serves to drop the parasitic resistance (17) of the p-type silicon semiconductor substrate (1) as illustrated in FIG. 2.

Accordingly, even if receiving backward noises among those of electronic apparatus generated outside the semiconductor chip and applying a voltage lower than ground potential (GND) to the n$^+$-type drain region (10b), most of electrons are implanted in the p$^+$-buried layer (16) through the p-well region (5) and recombined with the holes which are majority carrier of the p$^+$-type buried layer (16), and thus life of the electrons is shortened and their movement is inhibited. Therefore, the current collected in the n-well region (3) and coming up to the n$^+$-type well contact region (7) through the n-well region (3) is sufficiently small to turn on the parasitic PNP transistor (12) due to voltage drop in the parasitic resistance (14).

It is also sometimes the case that, if the field oxide film (2) and the n$^+$-type drain region (10b) are close to each other and when a voltage lower than GND is applied to the n$^+$-type drain region (10b), electrons are delivered to the p-type silicon semiconductor substrate (1) between the p-well region (5) and n-well region (3) and the p$^+$-type buried layer (16) through the p-well region (5), while being not delivered to the p$^+$-type buried layer (16). A part of the electrons are collected in the n-well region (3) and come to the n$^+$-type well contact region (7) through inside the n-well region (3). However, because potential difference between base and emitter is small with respect to a portion where p$^+$-type buried layer (16) is not formed due to reduction in the parasitic resistance (17), no turn-on of the parasitic NPN transistor (13) takes place.

Moreover, concentration in the region corresponding to the base of the parasitic NPN transistor (13) is high with respect to the portion where p$^+$-type buried layer (16) is not formed, recombination at the base takes place frequently, thus current amplification factor of the parasitic NPN transistor (13) being further reduced.

In other words, there is no turn-on of the parasitic PNP transistor (12) and parasitic thyrister, resulting in improvement of resistance to latchup.

Though the p+-type buried layer (16) is flatly formed by implanting boron ion directly into the surface of the p-type silicon semiconductor substrate (1) as illustrated in FIG. 3(a) in the foregoing embodiment, it is also preferable that after forming the thermal oxide film (18) on the p-type silicon semiconductor substrate (1), boron ion is implanted, then the p+-type buried layer (16) is flatly formed. It is also preferable that after forming the thermal oxide film (18) and the silicon nitride film (19) on the p-type silicon semiconductor substrate (1) in order, boron ion is implanted, then p+-type buried layer (16) is flatly formed. In both cases, the same advantage as the foregoing embodiment can be achieved.

Further, the same advantage as the foregoing embodiment is also achieved by implanting boron ion and forming p+-type buried layer (16) after removing the pattern of the resist (20) in the process illustrated in FIG. 3(d). In this case, a step is produced between the thermal oxide film (18) and the silicon nitride film (19). This step is, however, ignorable since thickness of the silicon nitride film (19) is hundreds Å or so, thus a flat p+-type burried layer (16) can be formed.

Furthermore, the same advantage as the foregoing embodiment is also achieved by implanting boron ion and forming the p+-type buried layer (16) after forming the field oxide film (2) illustrated in FIG. 3(e). In this case, a step is produced between the thermal oxide film (18) and the silicon nitride film (19). This step is, however, ignorable since thickness of the silicon nitride film (19) is hundreds Å or so. Thus, reflecting the contour of the field oxide film (2), the p+-type buried layer (16) is formed in such a manner as to be flat right under the flat portion of the field oxide film (2) and that of the thermal oxide film (18), while inclined right under the junction (portion not flat) between the field oxide film (2) and the thermal oxide film (2).

Figure 5:
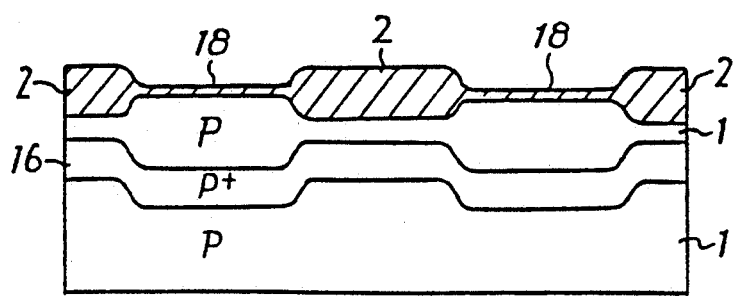

Further, the same advantage as the foregoing embodiment is also achieved by implanting boron ion and forming the p+-type buried layer (16) after removing the silicon nitride film (19) illustrated in FIG. 3(e). In this case, as illustrated in FIG. 5, reflecting the contour of the field oxide film (2), the p+-type buried layer (16) is formed in such a manner as to be flat right under the flat portion of the field oxide film (2) and that of the thermal oxide film (18), while inclined right under the junction (portion not flat) between the field oxide film (2) and the thermal oxide film (2).

Figure 6:
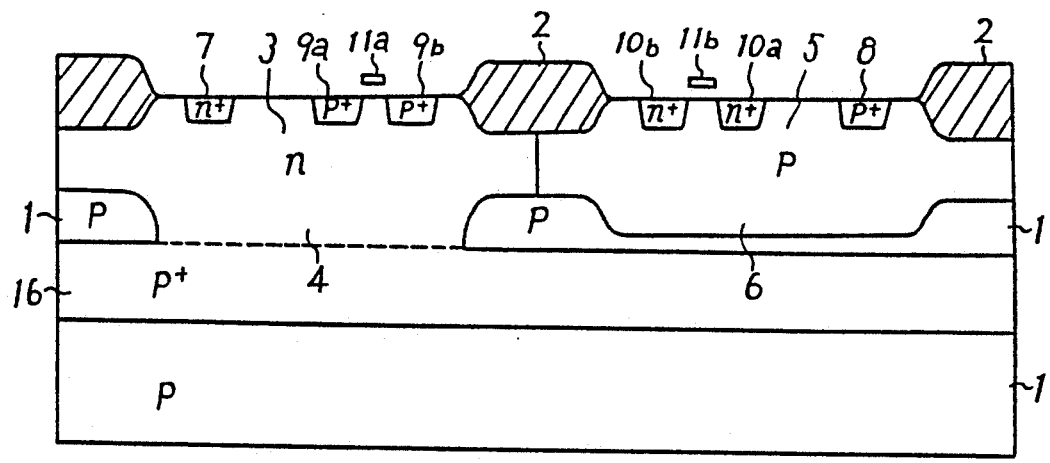

FIG. 6 shows a second embodiment of the present invention in which p+-type buried layer (16) is formed flatly at a depth of 1 to 2 μm from the main surface of a p-type silicon semiconductor substrate (1) and under the p-well region (5) in a depth range of 0.5 μm from the bottom of the p-well region (5) in such a manner as to be in contact with the bottom side of the n-well region (3). This embodiment also performs the same advantage as the foregoing embodiments.

Figure 7:
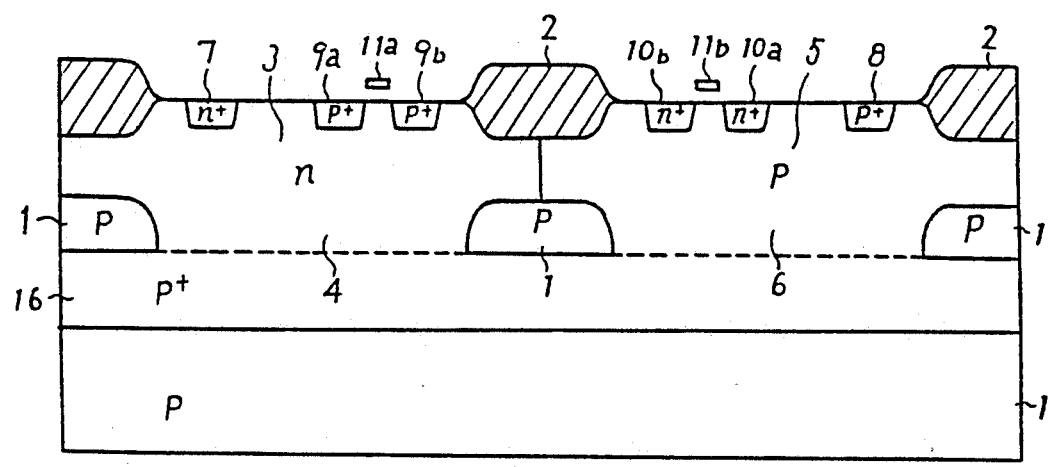

FIG. 7 shows a third embodiment of the present invention in which p+-type buried layer (16) of 1 to 4 μm in thickness is formed flatly at a depth of 1 to 2 μm from the main surface of the p-type silicon semiconductor substrate (1) and under the p-well region (5) in such a manner as to be in contact with the bottom side of the n-well region (3) and that of the p-well region (5). This embodiment also performs the same advantage as the foregoing embodiments.

Figure 8:
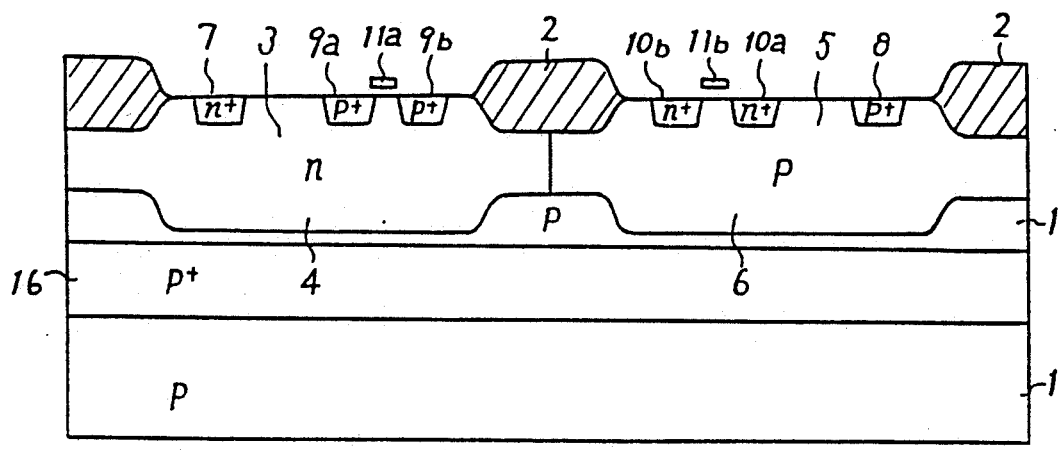
Figure 9:
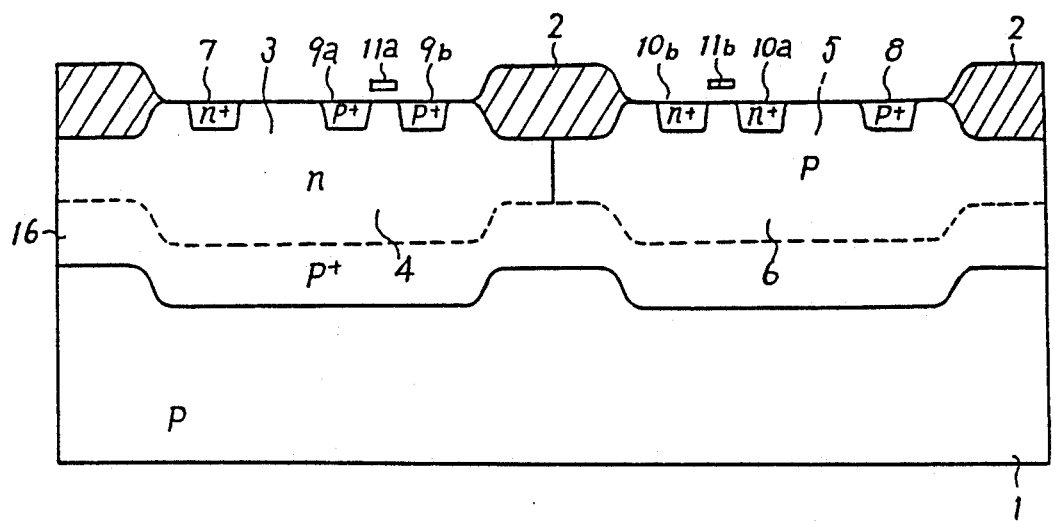
Figure 10:
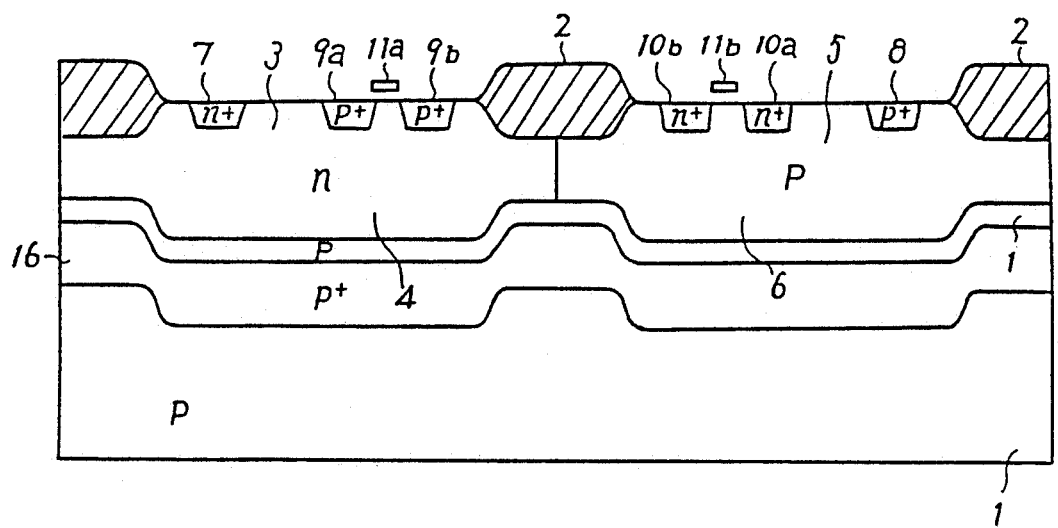
Figure 11:
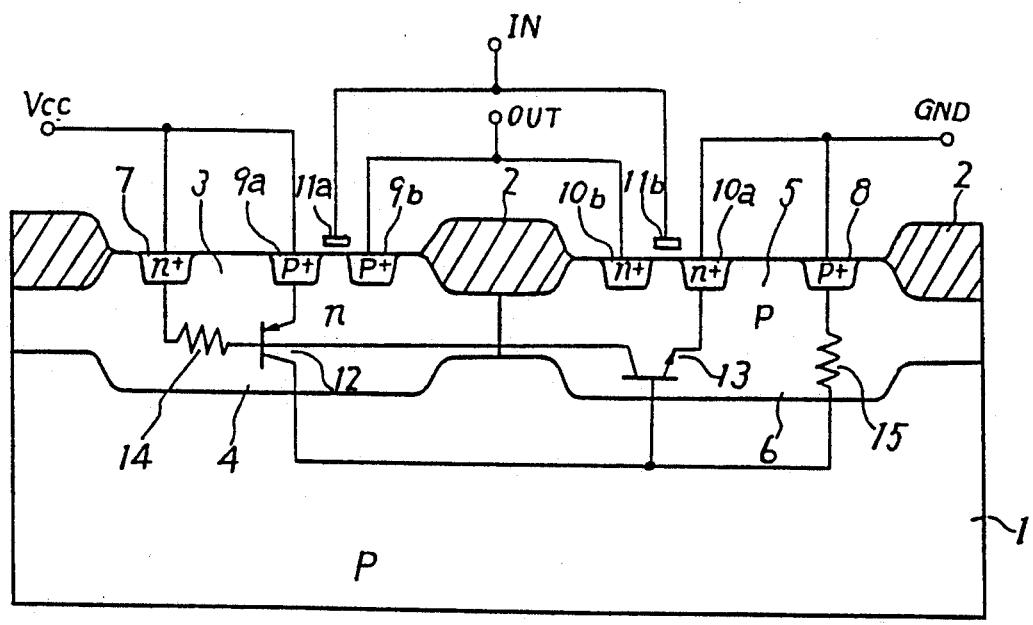
FIG. 11 is a structural sectional view and circuit diagram illustrating a structure of CMOS and parasitic thyrister equivalent circuit according to the prior art.

FIG. 8 shows a fourth embodiment of the present invention in which p+-type buried layer (16) of 1 to 4 μm in thickness is formed flatly at a depth of 1 to 15 μm from the main surface of a p-type silicon semiconductor substrate (1) and under the p-well region (5) in a depth range of 0.5 μm from the bottom of the p-well region (5) in such a manner as to be in contact with the bottom side of the n-well region (3). This embodiment also performs the same advantage as the foregoing embodiments. FIG. 9 shows a fifth embodiment of the present invention in which p+-type buried layer (16) of 1 to 4 μm in thickness is formed at a depth of 0.5 to 2 μm from the main surface of a p-type silicon semiconductor substrate (1) under the n-well region (3) and p-well region (5) along and in contact with the n-well region (3) and p-well region (5). This embodiment also performs the same advantage as the foregoing embodiments. FIG. 10 shows a sixth embodiment of the present invention in which p+-type buried layer (16) of 1 to 4 μm in thickness is formed at a depth of 0.05 to 15 μm from the main surface of a p-type silicon semiconductor substrate (1) and under the n-well region (3) and p-well region (5) along the n-well region (3) and p-well region (5) within a depth range of 10 μm. This embodiment also performs the same advantage as the foregoing embodiments.

Though implantation of boron ion is carried out in the channel region (26) of the P-channel transistor in the n-well region (3), on condition of 20 kev in accelerating voltage and $2.5 \times 10^{12}$ cm$^{-2}$ in dose, and implantation of arsenic ion follows on condition of 180 kev in accelerating voltage and $1.5 \times 10^{12}$ cm$^{-2}$ in dose in each of the foregoing embodiments, it is also preferable that phosphorus is used instead of arsenic in which boron ion is implanted on condition of 20 kev in accelerating voltage and $2.5 \times 10^{12}$ cm$^{-2}$ in dose and at the same time phosphorus ion is implanted on condition of 180 kev in accelerating voltage and $1.5 \times 10^{12}$ cm$^{-2}$ in dose. The same advantage as the foregoing embodiments is also performed in this modification.

As has been described so far, in the complementary MOS semiconductor device in accordance with the present invention, since a buried layer of high concentration is formed under a well region of first conduction type and a well region of second conduction type, an advantage is performed such that the buried layer can inhibit the parasitic thyrister from turning on due to surge or the like of semiconductor substrate from outside and inside, eventually providing a CMOS of which resistance to latchup is highly improved.

We claim:

1. A complementary MOS semiconductor device comprising: a semiconductor substrate of a first conduction type; a high concentration buried layer of the first conduction type having an impurity concentration higher than said semiconductor substrate; a well region of the first conduction type formed on one main surface of said semiconductor substrate located on upper side of said high concentration buried layer and in which an MOS transistor of a second conduction type is formed; and a well region of the second conduction type formed on said one main surface of the semiconductor substrate located on an upper side of said high concentration buried layer and in which an MOS transistor of the first conduction type is formed, at least one of said well regions being separated from said high concentration buried layer by said semiconductor substrate.

2. A complementary MOS semiconductor device as set forth in claim 1, wherein said well region of the first conduction type is connected to a ground power source, while said well region of the second conduction type is connected to a voltage source.

3. A complementary MOS semiconductor device as set forth in claim 1, wherein said well region of the first conduction type and said well region of second conduction type are formed into a retrograde well structure.

4. A complementary MOS semiconductor device as set forth in claim 1, wherein said high concentration buried layer is a layer formed by ion implantation.

5. A complementary MOS semiconductor device as set forth in claim 1, wherein said well region of the first conduction type and said well region of the second conduction type are separated from the high concentration buried layer by the substrate.

* * * * *